US008419958B2

(12) United States Patent
Wilson

(10) Patent No.: US 8,419,958 B2
(45) Date of Patent: Apr. 16, 2013

(54) USING POSITIVE DC OFFSET OF BIAS RF TO NEUTRALIZE CHARGE BUILD-UP OF ETCH FEATURES

(75) Inventor: Aaron R. Wilson, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 223 days.

(21) Appl. No.: 12/777,420

(22) Filed: May 11, 2010

(65) Prior Publication Data

US 2010/0213172 A1 Aug. 26, 2010

Related U.S. Application Data

(62) Division of application No. 11/362,409, filed on Feb. 23, 2006, now Pat. No. 7,713,430.

(51) Int. Cl.
*G01R 31/00* (2006.01)
*C23F 1/00* (2006.01)

(52) U.S. Cl.
USPC .................................. 216/61; 216/59; 216/67

(58) Field of Classification Search ............... 216/59, 216/61, 67
See application file for complete search history.

(56) References Cited

U.S. PATENT DOCUMENTS

| | | | |
|---|---|---|---|
| 4,298,443 A | 11/1981 | Maydan | |
| 4,622,094 A | 11/1986 | Otsubo | |
| 5,310,452 A * | 5/1994 | Doki et al. | 438/728 |
| 5,662,770 A | 9/1997 | Donohoe | |
| 5,920,238 A | 7/1999 | Cairns | |
| 5,983,828 A | 11/1999 | Savas | |
| 6,030,667 A | 2/2000 | Nakagawa et al. | |
| 6,187,151 B1 | 2/2001 | Leiphart | |
| 6,228,775 B1 | 5/2001 | Coburn et al. | |
| 6,361,645 B1 | 3/2002 | Schoepp et al. | |
| 6,475,920 B2 | 11/2002 | Coburn et al. | |
| 6,503,410 B1 | 1/2003 | Blalock et al. | |
| 6,516,742 B1 | 2/2003 | Blalock et al. | |
| 6,544,895 B1 | 4/2003 | Donohoe | |
| 6,555,402 B2 | 4/2003 | Wells et al. | |
| 6,649,469 B1 | 11/2003 | Wilson | |
| 6,716,758 B1 | 4/2004 | Donohoe et al. | |
| 6,784,108 B1 | 8/2004 | Donohoe et al. | |

(Continued)

OTHER PUBLICATIONS

Braithwaite et al., J. Phys. D: Appl. Phys. vol. 36, 2003, pp. 2837-2844.

(Continued)

*Primary Examiner* — Shamim Ahmed
(74) *Attorney, Agent, or Firm* — TraskBritt

(57) ABSTRACT

Apparatus, systems and methods for plasma etching substrates are provided that achieve dissipation of charge build-up on a substrate being plasma etched to avoid notching or twisting in high aspect ratio contents and similar features. Charge build-up on a substrate being etched by plasma etching can be dissipated by a method for etching a substrate, the method comprising: providing a plasma processing chamber comprising a chamber enclosure and a substrate support adapted to support a substrate within the chamber enclosure; supporting a substrate on the substrate support; forming a plasma within the chamber enclosure such that a surface of the substrate is in contact with the plasma; etching the substrate by generating a negative bias on the substrate surface relative to the plasma; and intermittently changing the bias on the substrate surface to positive relative to the plasma. The present method can be integrated into known plasma processing systems.

19 Claims, 6 Drawing Sheets

U.S. PATENT DOCUMENTS

| | | |
|---|---|---|
| 6,794,301 B2 | 9/2004 | Savas |
| 6,806,201 B2 | 10/2004 | Sumiya et al. |
| 6,833,325 B2 | 12/2004 | Huang et al. |
| 6,863,018 B2 | 3/2005 | Koizumi et al. |
| 6,916,746 B1 | 7/2005 | Hudson et al. |
| 6,939,813 B2 | 9/2005 | Blalock et al. |
| 7,059,267 B2 | 6/2006 | Hedberg et al. |
| 7,096,819 B2 | 8/2006 | Chen et al. |
| 7,097,782 B2 | 8/2006 | Blalock et al. |
| 7,135,410 B2 | 11/2006 | Jacobs et al. |
| 7,713,430 B2 | 5/2010 | Wilson |
| 2003/0024643 A1 | 2/2003 | Abatchev et al. |
| 2003/0164142 A1 | 9/2003 | Koshimizu |
| 2004/0000875 A1 | 1/2004 | Vahedi et al. |
| 2004/0219790 A1 | 11/2004 | Wilson |
| 2006/0027451 A1 | 2/2006 | Park et al. |

OTHER PUBLICATIONS

Armacost, et al., IBM J. Res. Develop., vol. 43, No. 1/2, Jan./Mar. 1999, pp. 39-72.

Matsui et al., Applied Physics Letters, vol. 78, No. 7, Feb 12, 2001, pp. 883-885.

Shibayama et al., Plasma Sources Sci. Technol. 5, 1996, pp. 254-259.

Fuard et al., J. Vac. Sci. Technol. B 19(6), Nov./Dec. 2001, pp. 2223-2230.

Schaepkens et al., Applied Physics Letters, Vol. 72, Issue 11, pp. 1293-1295.

* cited by examiner

USING POSITIVE DC OFFSET OF BIAS RF TO NEUTRALIZE CHARGE BUILD-UP OF ETCH FEATURES

CROSS-REFERENCE TO RELATED APPLICATION

This application is a divisional of U.S. patent application Ser. No. 11/362,409, filed Feb. 23, 2006, now U.S. Pat. No. 7,713,430, issued May 11, 2010.

TECHNICAL FIELD

The present invention relates generally to etching processes used in the semiconductor industry and, more specifically, to methods and apparatus for controlling charge build-up during plasma etching.

BACKGROUND

Higher performance, lower cost, increased miniaturization of electronic components, and greater density of integrated circuits are ongoing goals of the computer industry. One commonly used technique to increase density of integrated circuits involves stacking of multiple layers of active and passive components one atop another to allow for multi-level electrical interconnection between devices formed on each of these layers. This multi-level electrical interconnection is generally achieved with a plurality of metal-filled vias ("contacts") extending through dielectric layers that separate the component layers from one another. These vias are generally formed by etching through each dielectric layer by etching methods known in the industry, such as plasma etching. Plasma etching is also used in the forming of a variety of features for the electronic components of integrated circuits.

As described in U.S. Pat. No. 6,544,895, incorporated herein by reference, in plasma etching, a glow discharge is used to produce reactive species, such as atoms, radicals, and/or ions, from relatively inert gas molecules in a bulk gas, such as a fluorinated gas, such as $CF_4$, $CHF_3$, $C_2F_6$, $CH_2F_2$, $SF_6$, or other freons, and mixtures thereof, in combination with a carrier gas, such as Ar, He, Ne, Kr, $O_2$, or mixtures thereof. Essentially, a plasma etching process comprises: 1) reactive species being generated in a plasma from the bulk gas, 2) the reactive species diffusing to a surface of a material being etched, 3) the reactive species absorbing on the surface of the material being etched, 4) a chemical reaction occurring that results in the formation of a volatile by-product, 5) the by-product being desorbed from the surface of the material being etched, and 6) the desorbed by-product diffusing into the bulk gas.

In a plasma etching chamber for semiconductor manufacturing, a plasma is maintained by coupling energy from a power source into the plasma, which comprises mobile positively and negatively charged particles. An electric field, or bias voltage, develops in a sheath layer around the plasma, accelerating the ions toward the semiconductor substrate by electrostatic coupling. Applying an oscillating bias power can modulate the potential difference between the plasma and the semiconductor substrate. The difference between an instantaneous plasma potential and a surface potential defines a sheath potential drop. During the positive voltage phase, the substrate collects an electron current from electrons that have enough energy to cross the sheath layer while during the negative voltage phase, positive ions are accelerated by the sheath voltage drop, strike the substrate, and are collected by the substrate.

However, plasma etching processes (as well as ion implantation and other charge beam processes) may damage the semiconductor substrate and the devices and circuits formed therein or thereon. In particular, electrical charging is a well-known problem that can occur during the plasma processing of semiconductor devices, leading to the degradation of the device performance.

FIG. 6 depicts the conventional phenomenon of electrical charging on a semiconductor device 240 in the process of a plasma etch. A material layer 244 to be etched is shown layered over a semiconductor substrate 242. A patterned photoresist layer 246 is provided on the material layer 244 for the etching of a via. During the plasma etching process, the patterned photoresist layer 246 and material layer 244 are bombarded with positively charged ions 248 and negatively charged electrons 252 (i.e., the reactive species). This bombardment results in a charge distribution being developed on the patterned photoresist layer 246 and/or the semiconductor substrate 242. This charge distribution is commonly called "feature charging."

In order for feature charging to occur, the positively charged ions 248 and the negatively charged electrons 252 must become separated from one another. The positively charged ions 248 and negatively charged electrons 252 become separated by virtue of the structure being etched. As the structure (in this example a via 254) is formed by etching, the aspect ratio (height-to-width ratio) becomes greater and greater. During plasma etching, the positively charged ions 248 are accelerated (e.g., as a result of a DC bias at the semiconductor substrate 242) toward the patterned photoresist layer 246 and the material layer 244 in a relatively perpendicular manner, as illustrated by the arrows adjacent positively charged ions 248. The negatively charged electrons 252, however, are less affected by the DC bias at the semiconductor substrate 242 and, thus, move in a more random isotropic manner, as depicted by the arrows adjacent negatively charged electrons 252. This results in an accumulation of a positive charge at a bottom 256 of the via 254 because, on average, positively charged ions 248 are more likely to travel vertically toward the semiconductor substrate 242 than are negatively charged electrons 252. Thus, any structure with a high enough aspect ratio tends to charge more negatively at photoresist layer 246 and an upper portion of the material layer 244 to a distance A (i.e., illustrated with "−" indicia) and more positively at the via bottom 256 and the sidewalls 258 of the via 254 proximate the via bottom 256 (i.e., illustrated with "+" indicia).

As shown in drawing FIG. 7, the positively charged via bottom 256 deflects the positively charged ions 248 away from the via bottom 256 and toward the sidewalls 258 of the via 254, as a result of charge repulsion. The deflection results in an etching of the sidewalls 258 proximate the via bottom 256, which is known as "notching" or "twisting." Furthermore, the presence of the positively charged via bottom 256 slows the positively charged ions 248 as they approach the positively charged via bottom 256, thereby reducing etching efficiency.

Current High Aspect Ratio Contacts (HARCs) are known to twist at aspect ratios greater than about 20:1. Twisting is the deviation of the bottom of a contact from the centerline of the etch front. Twisting is caused by asymmetric charge build-up in and around the contact, which causes a lateral deviation of the ion projectory. The twisting may be so serious that the etch processes actually generate corkscrew-shaped contacts. The twisting of the contact is a concern for shorting contacts to other structures or to each other. Certain tools and chemistries help reduce the twisting, but all known tools show this phenomenon.

Twisting is a current failure mechanism for contacts on 95 nm parts and has required extensive process developments to overcome. HARC etches are probably the most difficult etch needed on DRAM parts and have very tight constraints on profiles, film selectivities, and Critical Dimensions (CDs). The twisting behavior of contacts will limit the aspect ratio of contacts that can be etched in the near future and there is little research to understand this phenomena and no known solution to eliminate it.

In a standard plasma etch system the ion angular distribution is very anisotropic whereas the electron angular distribution is very isotropic. For HARC features, the electrons will mainly strike the contact near the top of the feature; while ions will reach the bottom of the feature. This is what causes the top of the contacts to charge negative, while the bottom of the contacts charge positive. Small asymmetries in the top of the contacts due to photolithography or polymer loading will cause asymmetric charging at the top of the contact leading to bending of the incident ions. This will then cause the contact to etch faster on one side of the contact due to increased ion flux to this area.

BRIEF SUMMARY

A hallmark of the method of this invention is the use of DC power to reverse the sheath voltage in a plasma etch process, thereby dissipating a charge build-up on the substrate being etched.

In one aspect, the invention includes a plasma etching apparatus. In one embodiment, the etching apparatus comprises a plasma processing chamber with a chamber enclosure; a support adapted to hold or support a substrate within the chamber enclosure; a radio frequency (RF) power source configured to impose a negative bias across a substrate supported by the substrate support; a DC power supply configured to generate a positive voltage with respect to the plasma within the chamber and in intermittent electrical communication with the substrate support; and a control switch to select between connected and unconnected electrical communication between the DC power supply and the substrate support.

In another embodiment of the etching apparatus, the DC power supply comprises a function generator power supply configured to generate a varying positive DC voltage with respect to plasma within the chamber enclosure, wherein the function generator power supply is in electrical communication with the substrate support.

In yet another embodiment of the etching apparatus, the DC power supply comprises a function generator power source configured to generate a variable voltage signal, and the etching apparatus further includes a signal amplifier, wherein the alternating voltage signal imposes a bias relative to a plasma across a surface of a substrate supported by the substrate support.

In another aspect, the invention provides methods for etching a substrate. In one embodiment, the method comprises forming a plasma within a plasma processing chamber containing a substrate to be etched, etching the substrate by generating a negative bias on the surface of the substrate relative to the plasma, and intermittently changing the bias on the surface of the substrate to positive relative to the plasma. Exemplary substrates that can be etched by the methods of the invention include insulating materials (e.g., oxides, nitrides, polymers) utilizing a plasma comprising ionizable gases.

In another embodiment, the method comprises applying an RF signal to generate a negative bias on the surface of the substrate relative to the plasma to cause ions in the plasma to etch the substrate, and applying a varying DC voltage to the substrate support to intermittently change the bias on the surface of the substrate to positive relative to the plasma.

In a further embodiment, the method comprises applying a varying RF signal to generate a bias on the surface of the substrate, the bias varying from negative to positive relative to the plasma such that, when the bias is negative, ions in the plasma etch the substrate.

In yet another embodiment, the method comprises applying an RF signal to generate a negative bias on the surface of the substrate relative to the plasma to cause ions in the plasma to etch the substrate, generating a constant DC voltage signal that is positive relative to the plasma, and selectively operating a control switch between an open position that precludes electrical communication between the constant DC voltage signal and the substrate support and a closed position that establishes electrical communication between the constant DC voltage signal and the substrate support, such that when the switch is in a closed position, the constant DC voltage signal changes the bias of the surface of the substrate to positive relative to the plasma.

The invention provides devices and methods to etch high aspect ratio features. Features such as vias and contact openings that etched according to the invention advantageously are substantially free of feature charging, notching and/or twisting. The present invention can be readily integrated into conventional plasma processing systems.

BRIEF DESCRIPTION OF THE DRAWINGS

Preferred embodiments of the invention are described below with reference to the following accompanying drawings, which are for illustrative purposes only. Throughout the following views, reference numerals will be used in the drawings, and the same reference numerals will be used throughout the several views and in the description to indicate same or like parts or steps.

DETAILED DESCRIPTION

In the following detailed description, references are made to the accompanying drawings that form a part hereof, and in which is shown, by way of illustration, specific embodiments in which the invention may be practiced. These embodiments are described in sufficient detail to enable those skilled in the art to practice the invention, and it is to be understood that other embodiments may be utilized and that changes may be made without departing from the spirit and scope of the present invention. Although the examples presented are directed to the formation of an opening or via, it is understood that the present invention may be utilized in a variety of feature formations and plasma processes.

In the context of the current application, the term "semiconductor substrate" or "semiconductive substrate" or "semiconductive wafer fragment" or "wafer fragment" or "wafer" will be understood to mean any construction comprising semiconductor material including, but not limited to, bulk semiconductive materials such as a semiconductor wafer (either alone or in assemblies comprising other materials thereon), and semiconductive material layers (either alone or in assemblies comprising other materials). The term "substrate" refers to any supporting structure including, but not limited to, the semiconductive substrates, wafer fragments or wafers described above. Furthermore, when references are made to a wafer or substrate in the following description, previous process steps may have been used to form regions or junctions in the base semiconductor structure or foundation.

Figure 1:
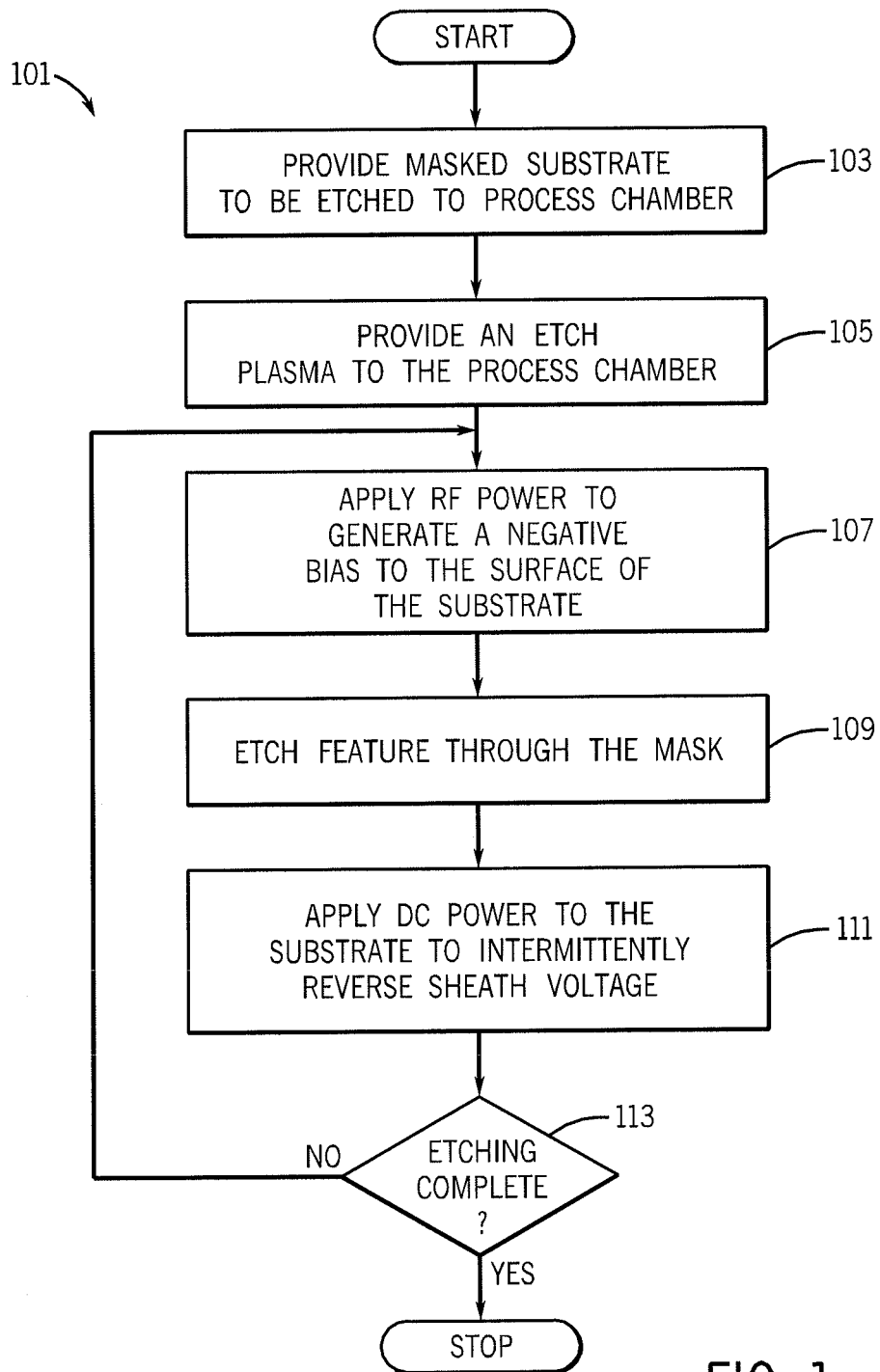
FIG. 1 is a flow diagram illustrating steps in etching a substrate according to an embodiment of a method of the present invention.
Figure 5A:
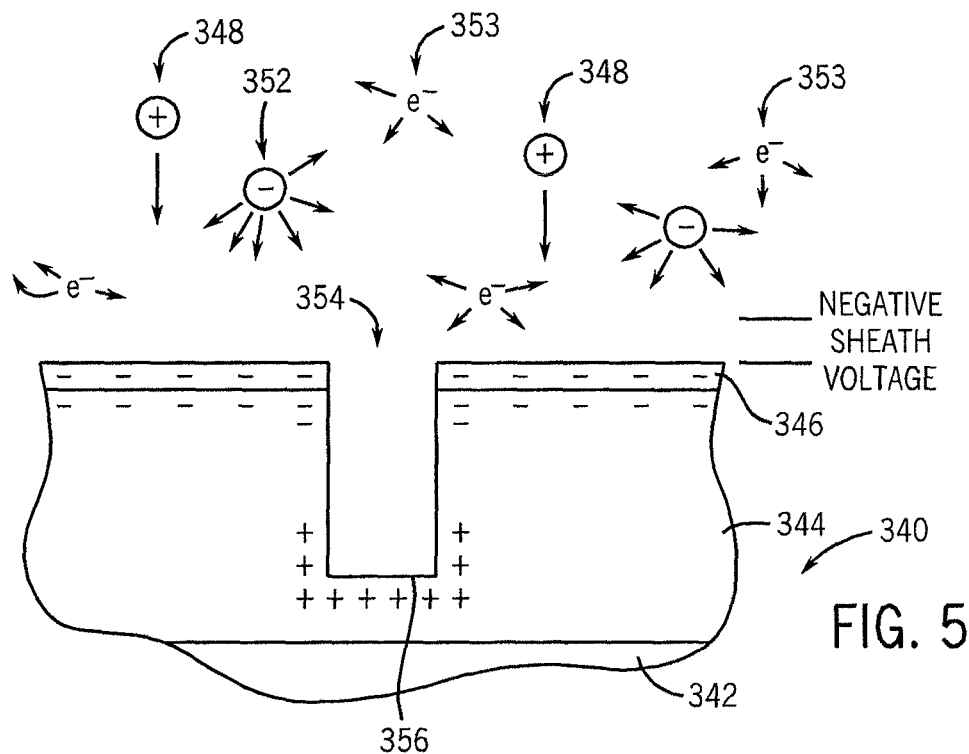
FIGS. 5A and 5B are cross-sectional views of a contact being etched according to an embodiment of a method of the invention as depicted in FIG. 1.
Figure 5B:
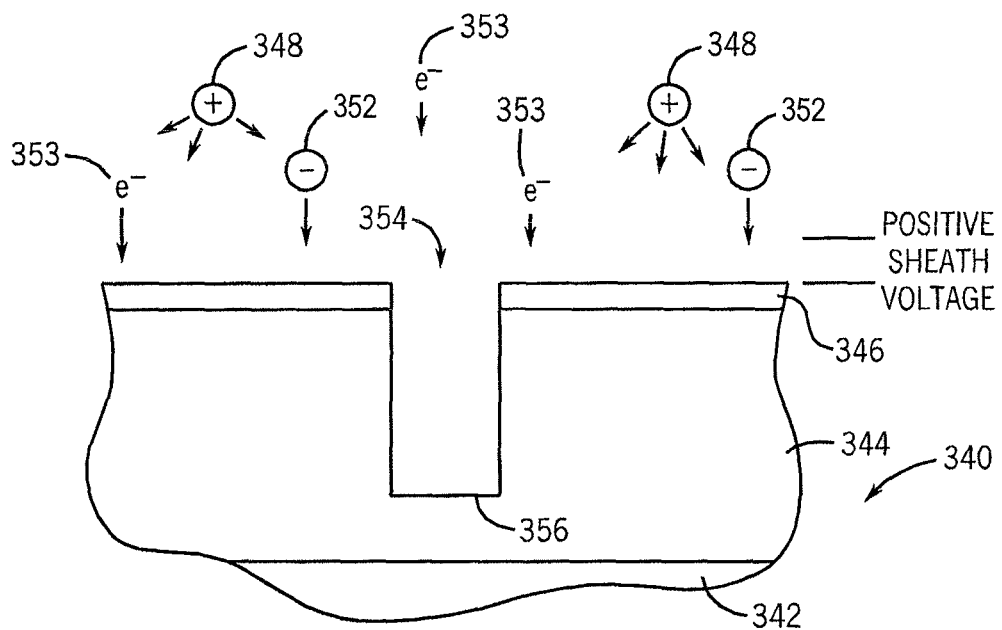
Figure 6:
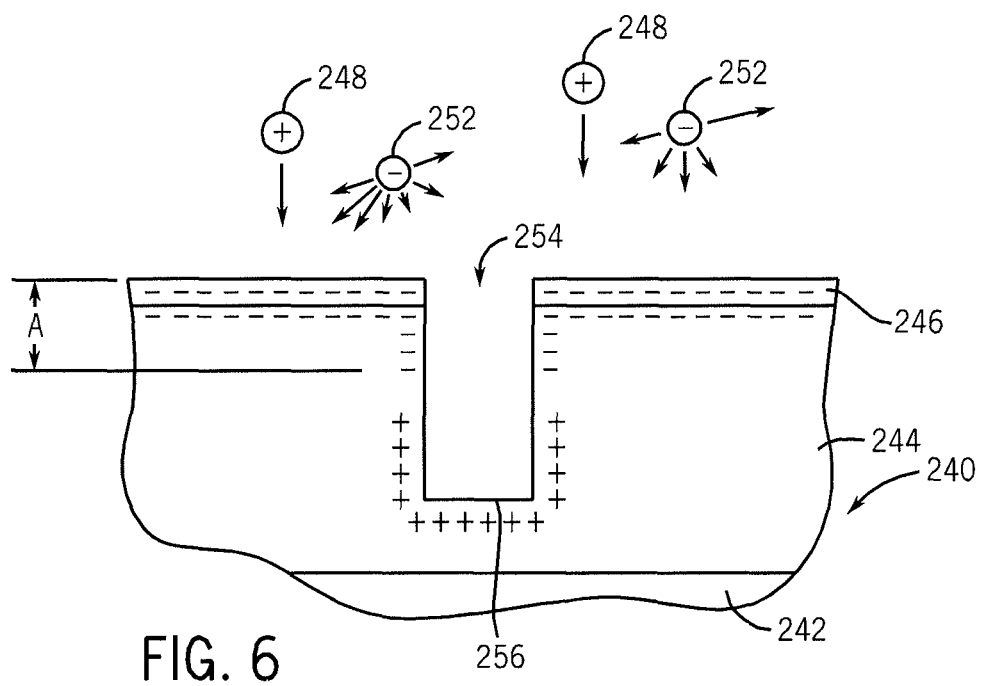
FIG. 6 is a cross-sectional view of a via during a prior art etching process that results in the phenomenon of feature charging.
Figure 7:
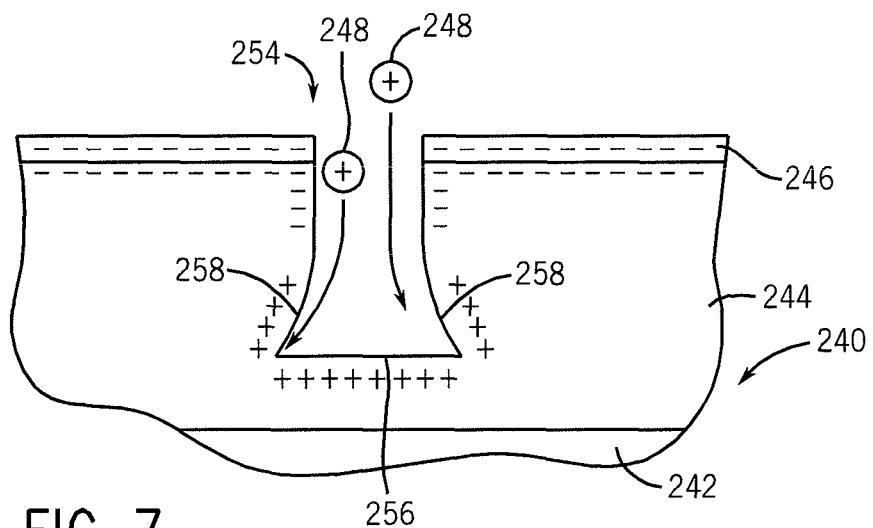
FIG. 7 is a cross-sectional view of a via during a prior art etching process wherein feature charging results in deflection of positively charged ions away from a bottom of the via and toward sidewalls of the via.

FIG. 1 shows a flowchart of an embodiment of an etching process 101 according to an embodiment of the invention for plasma etching a substrate while FIGS. 5A and 5B, which will be discussed concurrently with FIG. 1, show schematic representations of a substrate being etched by plasma in accordance with the embodiment of FIG. 1. FIGS. 5A and 5B illustrate a wafer fragment 340, as referred to herein as wafer 340, with a substrate 344 to be etched overlying a material layer 342, which can comprise an unprocessed semiconductor wafer or other substrate, the wafer 340 with various process layers formed thereon including one or more semiconductor layers or other formations, and active or operable portions of semiconductor devices. Exemplary materials for substrate 344 include oxides, nitrides, polymers, silicon, and other insulating and semiconducting materials.

In a first Step 103, wafer 340 with the substrate 344 to be etched, bearing a patterned mask layer 346 (e.g., photoresist over an oxide layer), is loaded into a plasma processing chamber (not shown) onto a support. Etch gases are fed into the plasma processing chamber, and a plasma is then generated within the chamber in Step 105.

The plasma generation is decoupled from wafer bias. Decoupling can be carried out with a variety of plasma reactors. Examples of sources used to create a plasma include an electron cyclotron resonance (ECR) source, an inductively coupled plasma (ICP), capacitive discharges, microwave discharges (e.g., applied by a surface wave process, etc.), or a helicon wave source, etc., all of which are well known in the art. The plasma may be generated utilizing a conventional etching device, such as an etcher available from Applied Materials, Inc., under the trade designation of ENABLER® etcher, a Kiyo TCP Oxide Etcher available from Lam Research Corporation, or other plasma etcher. It should be readily apparent to one skilled in the art that, depending upon the particular etching apparatus utilized to generate the plasma, various parameters provided herein can be modified to accomplish the objectives of the invention.

By way of example and not by way of limitation, an inductively coupled plasma (ICP) source of a dry or plasma processing apparatus, such as an ENABLER® etcher (Applied Materials, Inc., Santa Clara, Calif.) with a top and a bottom electrode (dual power chamber), can be used for the inventive plasma etching process. In the ENABLER® etcher, the top and bottom electrodes are not coupled. The top electrode is configured to provide a plasma source ("top power"), and the bottom electrode is configured to provide a bias voltage ("bottom power") and a wafer chuck. In the Enabler etcher, the bias power is provided as a RF signal to the bottom electrode. By increasing bottom RF power the bias voltage is increased across the substrate, which is positioned on the bottom electrode.

In Step 107, an RF signal is supplied to the plasma processing chamber. Self-rectification of the RF signal produces a negative bias on the surface of the wafer 340 with respect to the plasma. The RF power, and resultant negative substrate bias, provides the energy to drive the plasma ions to the surface of the wafer 340. Thereby, in Step 109, the plasma ions etch a portion of the substrate 344 (e.g., an oxide layer) exposed through openings of a patterned mask 346 to form a feature 354 (e.g., a via or contact). As shown in FIG. 5A, positive ions 348 will travel anisotropically toward the wafer 340 while negative ions 352 and electrons 353 travel more isotropically. The result is the typical charge separation with the photoresist layer 346 and an upper portion of the substrate 344 being more negatively charged and a bottom 356 of the etched feature 354 being more positively charged.

In Step 111, power is supplied to the wafer 340 (normally through a substrate support pedestal (not shown)) to intermittently reverse the sheath voltage from negative to positive. The reversal of the sheath voltage allows charge build-ups on the upper portion of the substrate 344 and at the bottom 356 of the etched feature 354 to dissipate. As shown in FIG. 5B, when the sheath voltage is positive, negative ions 352 and electrons 353 travel anisotropically toward the wafer 340, which facilitates negatively charged particles reaching the bottom 356 of feature 354 to offset the positive charge buildup from Step 109. Likewise, the positive ions 348 travel more isotropically when the sheath voltage is positive, which results in the positive ions 348 striking mainly the surface of the wafer 340 and upper portions of the etched feature 354 to offset the negative charge buildup at these portions of the wafer 340.

The intermittent reversal of the substrate bias can be accomplished by alternatively switching back and forth from a constant DC power supply, by providing a pulsed signal using a function generator and signal amplifier, or by using a pulsed DC power supply. These methods of reversing the bias and an apparatus for accomplishing the result are discussed in detail below.

In Step 113, if further etching is required, Steps 107, 109, 111 are repeated as necessary. If no further etching is required, the process can be terminated.

Figure 2:
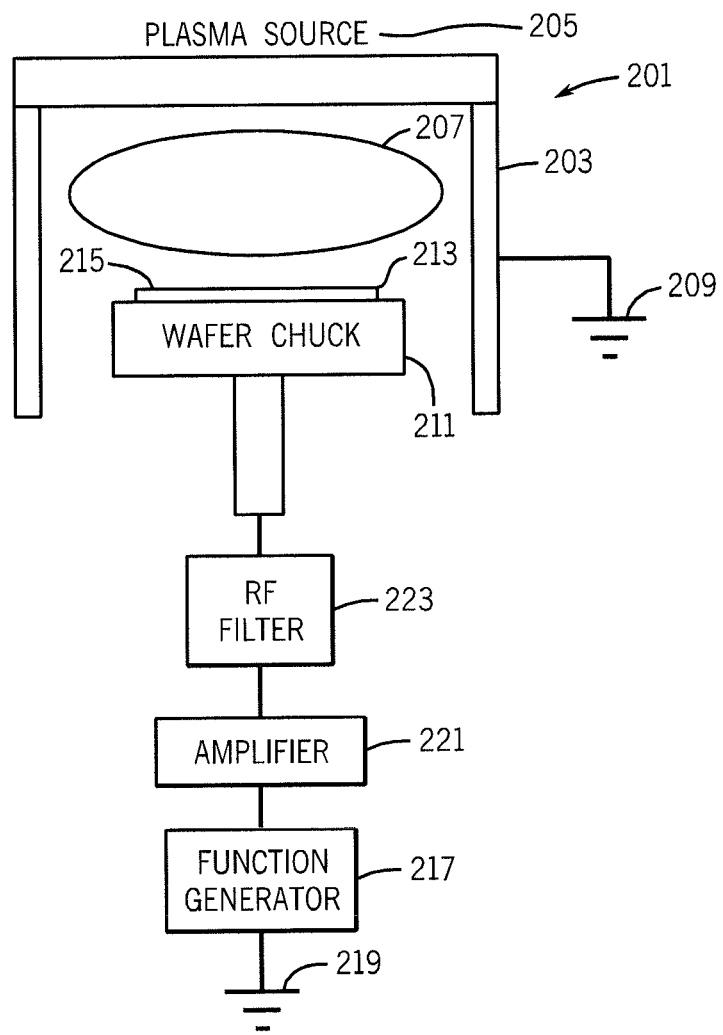
FIG. 2 is a schematic diagram showing one embodiment of an apparatus of the invention.

An embodiment of an apparatus for carrying out the method of invention is illustrated in FIG. 2. As shown, a plasma processing chamber 201 includes a chamber enclosure 203. The chamber enclosure 203 is electrically connected to ground 209. A plasma source 205 generates plasma 207 within the chamber enclosure 203. A wafer chuck 211 supports a substrate 213 (e.g., wafer) within chamber enclosure 203. Typically, the wafer chuck 211 is an electrostatic chuck (ESC). Wafer 213 has a surface 215 that is exposed to the plasma 207 for etching.

Attached to the chuck 211 is a function generator 217. The purpose of the function generator 217 is to generate an alternating electric signal whereby the voltage changes over time, which can be accomplished with conventional apparatus and processes. For this embodiment, the function generator 217 provides pulses of positive voltage with respect to ground 219, which alternate with pulses of less positive voltage (including zero voltage and negative voltage, if desired). The shape, frequency, amplitude and duration of such pulses can be adjusted depending on the etching performance.

A function generator is a device that can produce various waveform patterns of voltage at a variety of frequencies and amplitudes. Function generators are well known in the art and are frequently used as test equipment. Most function generators allow the user to choose the shape of the output from a number of options. Typical waveforms include a square wave where the signal goes directly from high to low voltage, a sine wave where the signal curves like a sinusoid from high to low voltage, and a triangle wave where the signal goes from high to low voltage at a fixed rate. These waveforms can be either repetitive or single-shot (once only) in which case some kind of triggering source is required (internal or external).

The amplitude control on a function generator varies the voltage difference between the high and low voltage of the output signal. The direct current (DC) offset control on a function generator varies the average voltage of a signal relative to the ground. The frequency control of a function generator controls the rate at which output signal oscillates. On some function generators, the frequency control is a combination of different controls. One set of controls chooses the broad frequency range (order of magnitude) and the other selects the precise frequency. This allows the function generator to handle the enormous variation in frequency scale needed for signals.

Function generators, like most signal generators, may also contain an attenuator, various means of modulating the output waveform, and often the ability to automatically and repetitively "sweep" the frequency of the output waveform (by means of a voltage-controlled oscillator) between two operator-determined limits. This capability makes it very easy to evaluate the frequency response of a given electronic circuit.

The signal from the function generator 217 is then amplified by amplifier 221 and fed into the wafer chuck 211. An RF filter 223 may be used between the amplifier 221 and the wafer chuck 211 to prevent feedback communication of the RF signal to the function generator 217. The net result is that the sheath voltage is forced to predetermined negative values. The change in sheath voltage accelerates negatively charged species (e.g., electrons and negative ions) to the surface of the substrate 213 and dissipates the positive charge build-up at the bottom 356 of the features 354, as depicted in FIGS. 5A and 5B and discussed earlier.

Figure 3:
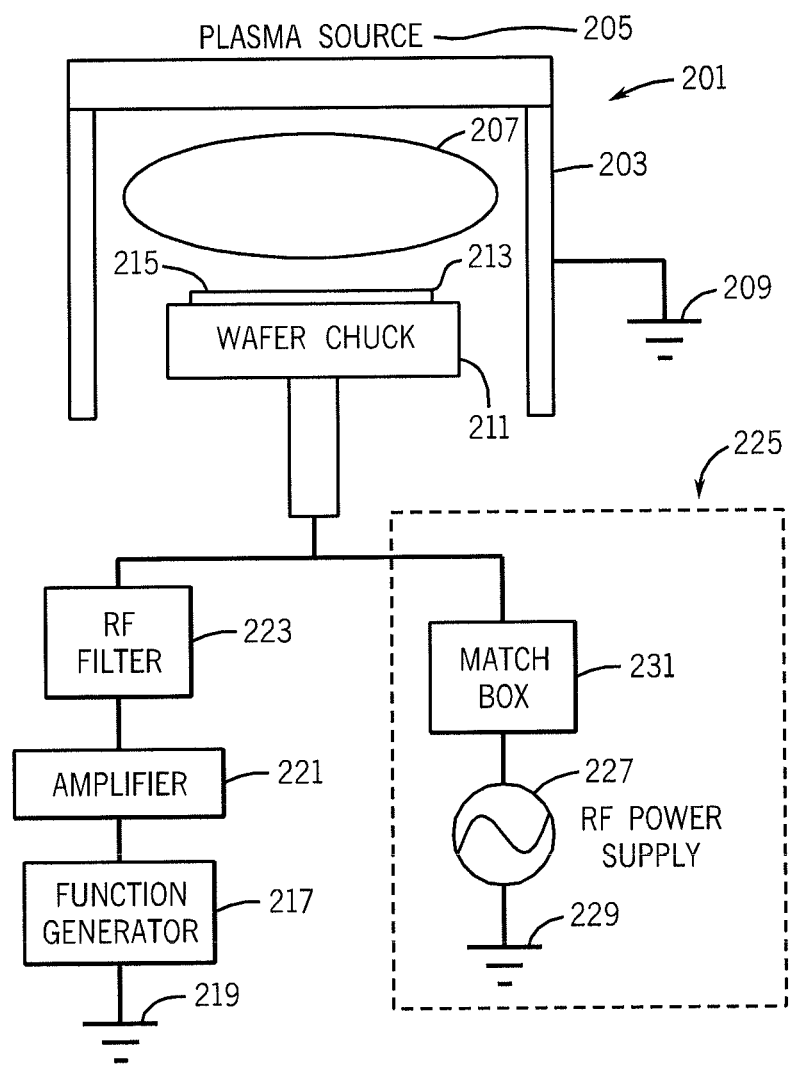
FIG. 3 is a schematic diagram showing another embodiment of an apparatus of the invention.

FIG. 3 illustrates another embodiment of a plasma etch apparatus according to the invention. The parts and functions of the labeled components of FIG. 3 are identical to the same numbered components as in FIG. 2. The process of the plasma etch apparatus of FIG. 3 differs in that an RF Power is supplied to the wafer 213 in a conventional manner, as depicted by dashed box 225. The RF power supply 227 is connected to a ground 229. The signal from the RF power supply 227 is fed to chuck 211 through matchbox 231. The net result is that the sheath voltage is forced to predetermined negative values for a short period of time, thereby accelerating negatively charged species to the surface 215 of the wafer 213 and dissipating the positive charge build-up at the bottom of the contacts (FIGS. 5A and 5B).

It is common to use tuning components to help match the impedance of the plasma to the output impedance of the RF power supply. These components, usually a shunt capacitor to ground and a series 3-4-turn inductor, are located along with the series capacitor in the "matchbox," which is physically located adjacent to the cathode position. The inductor is fixed, and both of the capacitors (shunt and series) are variable. A control circuit within the matchbox controller senses the reflected power (from the matchbox and plasma back to the power supply) and adjusts the variable capacitors to minimize the reflected power. Usually this is done automatically by means of reversible motor drives on the capacitors, but occasionally laboratory-based systems will have manual controls for the tuning network.

Figure 4:
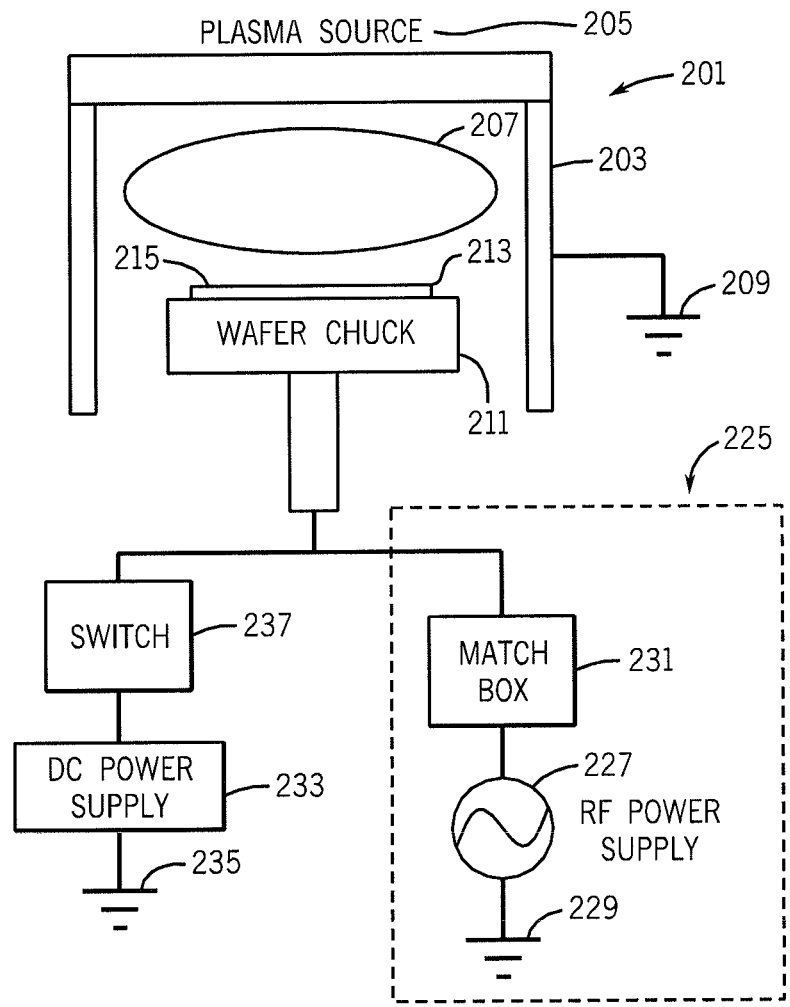
FIG. 4 is a schematic diagram of another embodiment of an apparatus of the invention.

FIG. 4 illustrates another embodiment of a process and a plasma etch apparatus according to the invention. Plasma processing chamber 201, chamber enclosure 203, plasma source 205, plasma 207, ground 209, wafer chuck 211, substrate 213, and surface 215 of substrate 213 are as described with respect to the plasma etch apparatus of FIG. 2. The RF power supply as shown by dashed box 225 is as described with respect to the plasma etch apparatus of FIG. 3. A DC power supply 233, which generates a constant positive voltage with respect to the plasma 207, is additionally attached to the wafer chuck 211. The DC power supply 233 is connected to a ground 235. The positive voltage signal from DC power supply 233 is fed through a switch 237 that can alternate back and forth between open (unconnected) and closed (connected) positions. When connected, the DC power supply 233 changes the sheath voltage to determined positive values for the duration of the connection. Opening the connection allows the negative bias to reestablish on surface 215 of substrate 213.

In the present example of plasma etching an oxide layer, a preferred source for plasma 207 is a fluorocarbon or hydrofluorocarbon feed gas. When utilized to generate a plasma, those feed gases dissociate resulting in fragments for use in an oxide etching process, for example, $C_xH_3F_2^+$ ions or $C_xF_2^+$ ions. Exemplary fluorocarbon or hydrofluorocarbon gases include $CF_4$, $CHF_3$, $C_2F_6$, $C_3F_6$, $CH_2F_2$, $C_2HF_5$, among others, and can be used alone or in combination with another gas such as hydrogen ($H_2$) or oxygen ($O_2$) to adjust the nature of the carbon- and fluorine-containing ions within the plasma.

Thus, the present invention is capable of providing a simple and controllable method of affecting the quality and efficiency of plasma etching and is easily implemented on most existing plasma reactors. The present invention is useful in etching apertures having a length-to-diameter ratio of 20:1 or greater in insulating materials deposited by chemical vapor deposition techniques. Such insulating materials include oxides, nitrides, polymers, combinations thereof, etc. Furthermore, although the examples presented are directed to the formation of an opening or via, it is understood that the present invention may be utilized in a variety of feature formation and plasma processes.

The reduction of charge build-up could also be applied to line and space structures or any other feature where the build-up of charge is causing negative effects. Other negative effects of charge build-up (besides twisting) are notching, aspect ratio dependent etch rate, profile distortion of the etched feature (bow and tapered profiles, for example), and etch stop to name a few. One application that is significantly different would be the reduction of charge build-up that leads to micro-arcing during the etch process. Micro-arcing can occur at the edge of the wafer where the lithography pattern is disturbed while forming discontinuous films. We believe this may be caused by charge build-up of the feature that then discharge when another conducting layer is contacted. This causes a micro-arc and damages the wafer. Micro-arcs can also cause a chain reaction leading to larger arcing events damaging the wafer and the chamber.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A method for etching a substrate, comprising:
contacting a surface of a substrate situated on a support with a plasma within a processing chamber;
providing an RF voltage signal to the processing chamber to impose a negative bias on the surface of the substrate relative to the plasma to form an opening in the substrate;
generating a constant DC voltage signal that is positive relative to the plasma; and
selectively operating a control to switch between an open position that precludes electrical communication between the constant DC voltage signal and the support and a closed position that establishes electrical communication between the constant DC voltage signal and the support to intermittently supply the constant DC voltage signal to the support at an amplitude, frequency, and duration to cause the negative bias on the surface of the substrate to change to a positive bias on the surface of the substrate relative to the plasma.

2. The method of claim 1, wherein selectively operating a control comprises delivering a pulsed positive DC voltage signal ranging from a positive voltage to a less positive voltage to the support.

3. The method of claim 1, wherein the constant DC signal voltage is a waveform pattern signal.

4. The method of claim 3, wherein the waveform pattern signal is a sinusoid waveform pattern signal.

5. The method of claim 3, wherein the waveform pattern signal is a triangle waveform pattern signal.

6. The method of claim 1, wherein selectively operating a control comprises supplying the constant DC voltage signal to the support to decrease positive charge build-up within the opening.

7. The method of claim 1, wherein contacting a surface of a substrate situated on a support with a plasma comprises decoupling plasma generation from substrate bias.

8. The method of claim 1, wherein contacting a surface of a substrate situated on a support with a plasma comprises contacting the surface of the substrate with the plasma generated by a plasma source selected from the group consisting of an electron cyclotron resonance source, an inductively coupled plasma source, a surface wave plasma source, a helicon wave plasma source, and a capacitive coupled plasma source.

9. A method for etching a substrate, comprising:
providing an RF voltage signal to a processing chamber housing a plasma to impose a negative bias on a surface of a substrate relative to the plasma to form an opening in the substrate; and
selectively operating a control to intermittently supply a positive DC voltage signal to a support of the substrate at an amplitude, frequency, and duration effective to cause the negative bias on the surface of the substrate to change to a positive bias on the surface of the substrate relative to the plasma, wherein the control is switched between an open position that prevents electrical communication between the positive DC voltage signal and the support and a closed position that permits electrical communication between the positive DC voltage signal and the support.

10. A method for etching a substrate, comprising:
contacting a surface of a substrate within a processing chamber with a plasma;
providing an RF voltage signal to the processing chamber to generate and impose a negative bias on the surface of the substrate relative to the plasma to form an opening in the substrate; and
selectively operating a control to intermittently deliver a positive DC voltage signal as a pulsed signal ranging from a positive voltage to a less positive voltage at an amplitude, frequency, and duration effective to cause the negative bias on the surface of the substrate to change to a positive bias on the surface of the substrate relative to the plasma.

11. A method for etching a substrate situated on a support, comprising:
forming an opening in a substrate in the presence of a plasma while providing an RF voltage signal to impose a negative bias on the substrate;
generating a constant DC voltage signal that is positive relative to the plasma; and
selectively operating a control switch during the forming to intermittently provide the constant DC voltage signal to a substrate support to dissipate positive charges on the substrate.

12. The method of claim 11, wherein intermittently providing the constant DC voltage signal to the substrate support comprises intermittently providing the DC voltage signal at an amplitude, frequency, and duration effective to dissipate the positive charges on the substrate.

13. The method of claim 11, wherein selectively operating a control switch comprises delivering a pulsed positive DC voltage signal ranging from a positive voltage to a less positive voltage to the substrate support.

14. The method of claim 11, wherein providing an RF voltage signal comprises providing the RF voltage signal through a matchbox to the substrate support.

15. A method for etching a substrate situated on a support, comprising:
forming an opening in a substrate in the presence of a plasma in a processing chamber while providing an RF voltage signal to the processing chamber to impose a negative bias on the substrate;
generating a constant DC voltage signal that is positive relative to the plasma; and
selectively operating a control switch during the forming to intermittently provide the constant DC voltage signal to a substrate support to change a plasma sheath voltage to a positive value and for a duration to dissipate positive charges on the substrate and within the opening, and then to cease providing the DC voltage signal to the substrate support and allow the RF voltage signal to re-impose the negative bias on the substrate.

16. A method for etching a substrate situated on a support, comprising:
providing an RF voltage signal to a substrate in the presence of a plasma to form an opening in the substrate; and
operating a control during the formation of the opening to intermittently provide a positive DC voltage signal to a substrate support to intermittently vary a bias on the substrate from negative to positive relative to the plasma.

17. A method for etching a substrate, comprising:
providing an RF voltage signal to a substrate in the presence of a plasma to impose a negative bias on the substrate to form an opening in the substrate; and
during the formation, operating a control switch to intermittently provide a positive DC voltage signal to the substrate to impose a positive bias on the substrate for a duration effective to dissipate positive charges on the substrate and in the opening, and then operating the control switch to cease providing the positive DC voltage signal and continue forming the opening.

18. A method for etching a substrate, comprising:
providing an RF voltage signal to a substrate in the presence of a plasma to generate a negative bias on the substrate to etch an opening in the substrate; and
during the etch, operating a control switch to intermittently provide a positive DC voltage signal to the substrate to intermittently reverse a plasma sheath voltage.

19. The method of claim 1, wherein selectively operating a control comprises delivering a pulsed positive DC voltage signal ranging from a positive voltage to a less positive voltage including a zero voltage to the support.

* * * * *